United States Patent [19]
Grant

[11] Patent Number: 5,302,912
[45] Date of Patent: Apr. 12, 1994

[54] PUSH-PULL AUDIO AMPLIFIER WITH CROSSOVER DISTORTION COMPENSATION

[76] Inventor: Alan M. Grant, P.O. Box 102, Erieville, N.Y. 13061

[21] Appl. No.: 60,089

[22] Filed: May 10, 1993

[51] Int. Cl.$^5$ ............................. H03F 3/26; H03F 3/28
[52] U.S. Cl. ......................................... 330/118; 330/3
[58] Field of Search ............... 330/118, 190, 150, 179, 330/195, 182, 3, 122

[56] References Cited

U.S. PATENT DOCUMENTS

| | | |
|---|---|---|
| 2,233,961 | 3/1941 | Rockwell . |
| 2,593,490 | 4/1952 | Sanders ................................ 330/151 |
| 2,704,489 | 3/1955 | Hammond, Jr. et al. . |
| 3,995,226 | 11/1976 | Berning . |

Primary Examiner—William L. Sikes
Assistant Examiner—Fetsum Abraham
Attorney, Agent, or Firm—Harris Beach & Wilcox

[57] ABSTRACT

A high-performance, distortion-free, audio push-pull amplifier has a class A driver stage that drives a class B push-pull output stage that is coupled to a load through a transformer that has a center tap primary with screen taps. The driver tube cathodes are coupled to the output tube grids. The driver tube plates are tied to the screen taps on the output transformer primary. These taps are also coupled to the output tube screen grids. At low power levels the driver stage drives the load through the output transformer. As power level rises the power stage supplies more and more of the output power. This circuit avoids notch or crossover distortion at low power levels.

10 Claims, 2 Drawing Sheets

1/2 PUSH PULL

1/2 PUSH PULL

PUSH-PULL AUDIO AMPLIFIER WITH CROSSOVER DISTORTION COMPENSATION

BACKGROUND OF THE INVENTION

This invention relates to high-performance, ultra-linear, i.e. distortion-free, audio amplifiers. The invention is particularly concerned with tube-type amplifiers in which the power stage includes a pair of vacuum tube amplifier devices connected in push-pull.

Vacuum tube audio amplifiers have remained attractive for high performance audio use, because of their extreme linearity and distortion-free characteristics. Class B amplifiers are employed for this because of their relatively high output power and efficiency. However, in push-pull operation, class B amplifiers do produce notch or crossover distortion when operated at low power levels.

Push-pull class B output stages draw grid current in operation. This grid current is supplied to it by a driver stage, which can be a triode device, operated in class A. This can be configured to drive a transformer having a low-resistance secondary coupled to the power or output tube grids. It is preferred to employ a push-pull driver stage formed of cathode-follower triodes. However, in any case the problem of crossover distortion remains.

OBJECTS AND SUMMARY OF THE INVENTION

It is an object of this invention to provide an audio amplifier with extreme linearity at both high and low output levels.

It is another object to provide a linear audio amplifier with a push-pull class B power output stage, configured so as to avoid notch or crossover distortion.

According to an aspect of this invention, the amplifier circuit has a driver stage formed of a pair of cathode ac triodes configured in push-pull, with the cathodes ac coupled to the control grids of the output stage tubes. The output stage is formed of two amplifier tubes configured in push-pull and operated in class B so that one side is driven at a time. These tubes have their cathodes grounded and their anodes or plates connected to outer taps of the output transformer primary. The center tap of the transformer primary is connected to plate voltage $+V_B$ to provide plate current to the output or power tubes. The anodes or plates of the driver stage triodes are not coupled directly to plate voltage $+V_B$, but are connected instead to intermediate taps on the output transformer primary. These are the same taps that are connected to the screen grids of the output or power tubes.

By connecting the driver stage in this manner and biasing the output or power tubes nearly to cutoff (i.e. for class B operation) a condition occurs at low power levels where most of the current is fed through the output transformer primary coming from the driver stage. This drives the load directly through the output transformer.

As the driver stage operates in class A little if any distortion is introduced.

As power increases, the power or output stage supplies more and more of the output current. At higher power levels, the driver stage still furnishes a fraction of the total output current, but most is supplied by the power or output stage.

The intermediate taps on the output transformer primary, to which the anodes of the driver stage are connected, are the usual screen taps that are furnished on output transformers for ultra-linear operation. Thus, no special winding is needed on the output transformer.

The output tubes can be triodes, tetrodes, pentodes or ultra-linear pentodes. In the case of pentodes, suppressor grids can be coupled to the cathodes. Also, screen resistors can be connected between the transformer screen taps and the respective screen grids to keep the driver stage plate signal from feeding back to the screen grids.

Also, the term class B operation, as used in this description and the ensuing claims, is meant to cover operation in which the tube operates linearly over the forward part of the signal. For example, class AB and class AB2 operation would also be covered.

Moreover, it is possible to use transistors as the driver amplifier devices (configured as emitter-followers or source-followers), although vacuum tube amplifiers are preferred. Other vacuum tubes, e.g. tetrodes or pentodes, can be used as drivers.

The above and many other objects, features, and advantages of this invention will become apparent from the ensuing description of a preferred embodiment, to be read in connection with the accompanying Drawing.

DETAILED DESCRIPTION OF THE PREFERRED EMBODIMENTS

Figure 1:
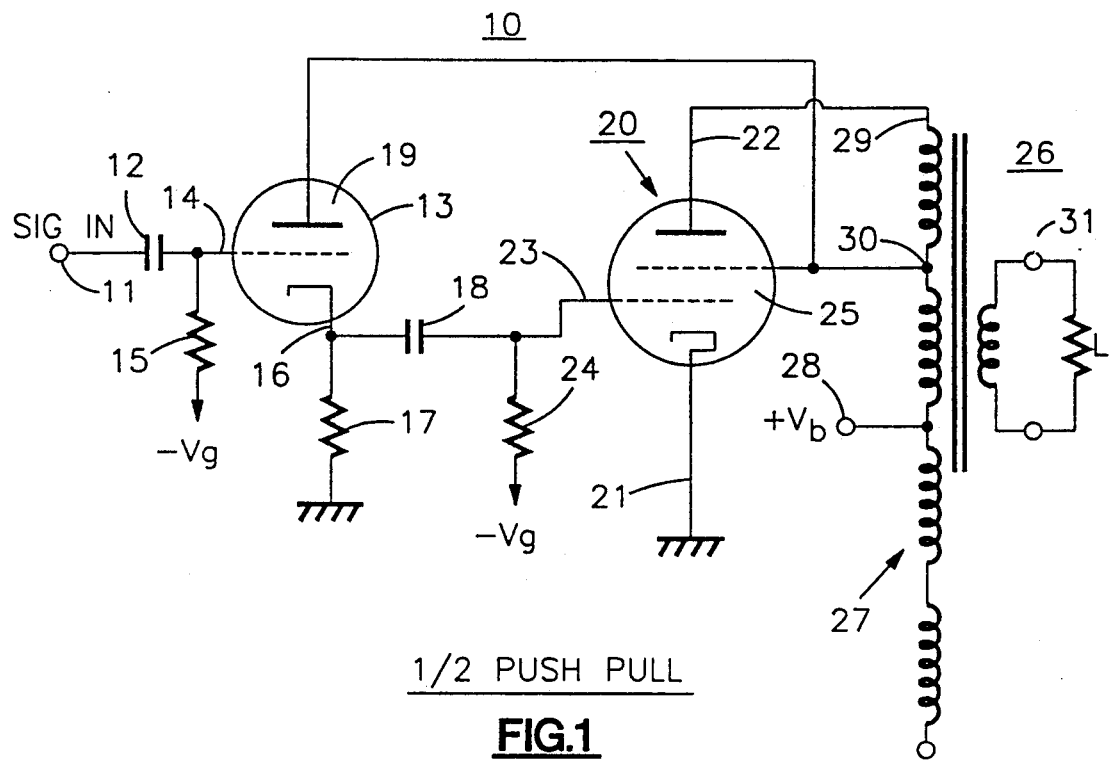
FIG. 1 is a schematic circuit diagram illustrating an amplifier according to an embodiment of this invention.

With reference to the Drawing FIG. 1 shows half of a two-stage push-pull audio amplifier 10. The other half of the amplifier is a mirror image, and has been omitted from this illustration only to simplify the explanation of circuit operation.

An input signal, e.g. from a preamplifier, is fed to a signal input 11 which is coupled via a coupling capacitor 12 to a driver triode 13, here configured as a cathode follower. The triode has a control grid 14 connected to a bias resistor 15 which is a part of a bias network, to bias the triode for class A operation.

The control grid 14 also connects to the capacitor 12 to receive the input signal. A cathode 16 is coupled through a cathode resistor 17 to ground, and is also ac coupled through coupling capacitor 18 to the power output stage. The triode 13 has its anode or plate 19 connected to a dc plate voltage source in a manner to be described shortly.

The output or power amplifier includes a tube amplifier device, here shown as a tetrode 20, configured with a grounded cathode 21 for operation as a class B amplifier. The tetrode has a control grid connected via the coupling capacitor 18 to the driver triode 13 and also coupled through biasing resistor 24 to a grid bias voltage $-V_G$. A screen grid 25 is interposed between the control grid 23 and the plate or anode 22.

An output transformer 26 couples the output tube 20 to a load L which can be, e.g. a speaker. The output transformer has a multi-tap primary 27, with a center tap 28 connected to the source of plate voltage $+V_B$ and an end tap 29 connected to the anode or plate 22. An intermediate tap 30, i.e. positioned between the center tap 28 and end tap 29, is connected to the plate or anode 19 of the driver triode 13 to supply plate voltage to it. This tap 30 is also connected to the screen grid 25 as is conventional in highly linear vacuum tube amplifier circuits. These taps 30 are usually referred to as screen taps.

The output transformer 26 also has a secondary 31 coupling the amplifier tube 20 to the load L.

The illustrated portion of the push-pull amplifier is operative for the forward or positive part of each wave of the input signal, but because of the class B biasing of the tube 20, is cut off during the other, negative part of the wave. At the latter times, the other (not shown) portion of the push-pull amplifier is operative and supplies the remaining part of the amplified output.

For moderate to high power operation, most of the current through the output transformer primary 27 is supplied by the plate 22 of the power amplifier tube 20. However, at low power there is cross-over distortion, i.e. at or near cutoff of the tube 20. For low power, plate current from the driver triode 13 through the tap 30 tends to dominate. Because the triode 13 is operated class A, there is very little distortion. Thus, at low power levels the driver is coupled directly, i.e., through the output transformer 26, to the load 31 to yield an output without the notch or crossover distortion.

Figure 2:
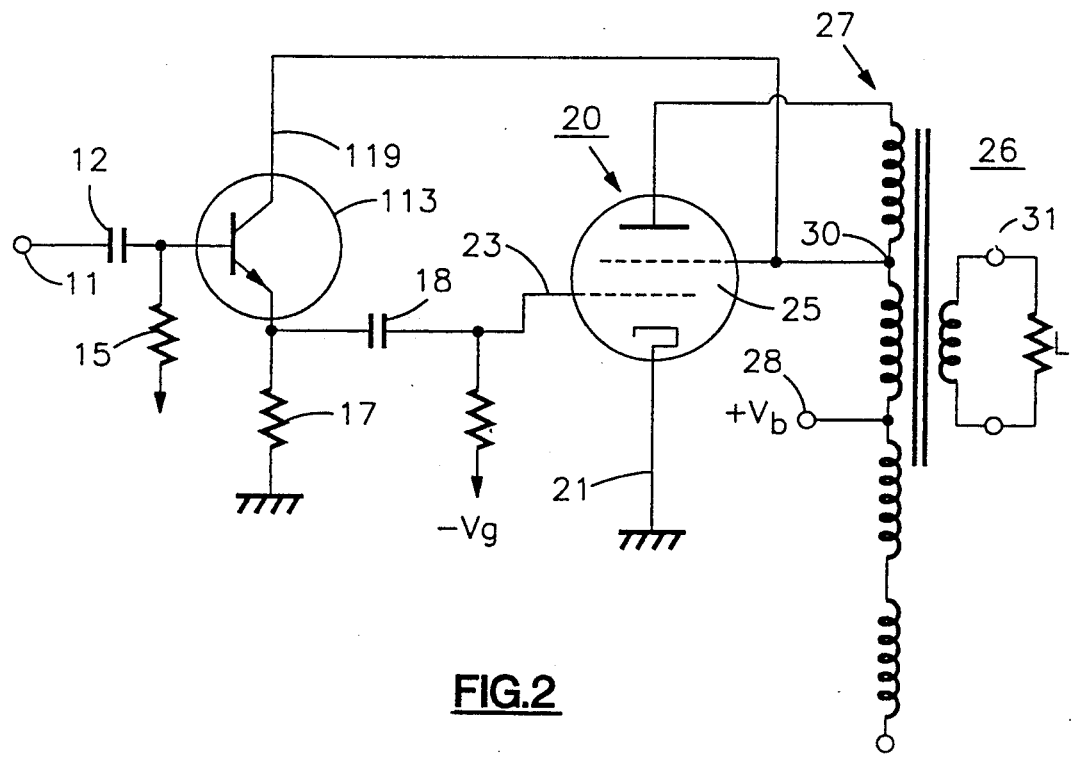
FIG. 2 is a schematic circuit diagram illustrating an alternative embodiment.

FIG. 2 illustrates a variant of the first embodiment, and similar elements are identified with the same reference numbers, and for such elements a detailed description need not be repeated. The driver stage includes a transistor amplifier 113 connected as an emitter follower with its base coupled through the capacitor 12 to the input 11, its emitter serving as current output electrode, coupled through the capacitor 18 to the control grid 23 of the tube 20, and a collector 119 serving as current input electrode and joined to the screen tap 30 of the transformer primary 27. In another alternative embodiment, an FET could serve as the driver amplifier element, in that case configured as a source follower.

Figure 3:
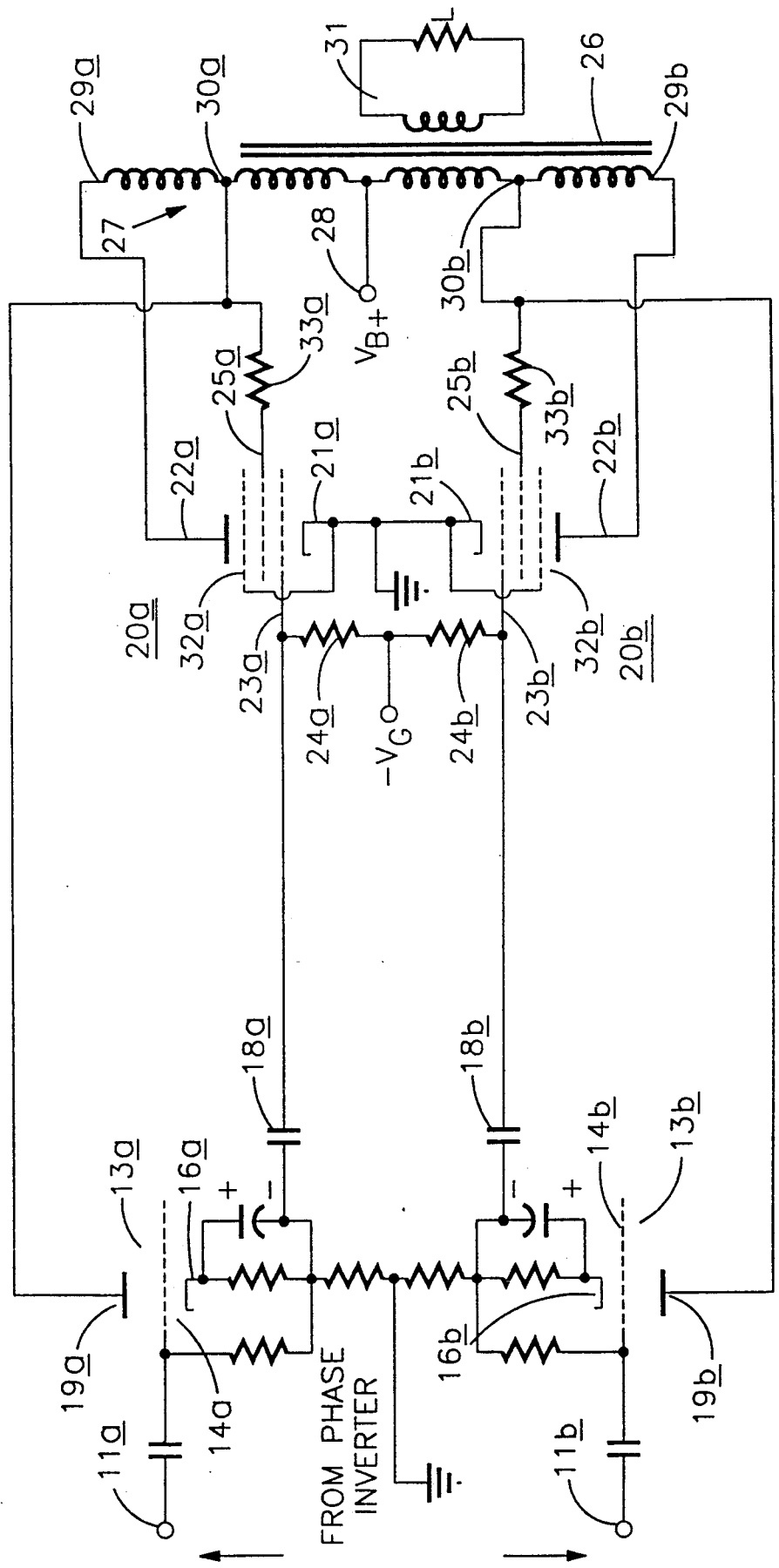
FIG. 3 is a schematic circuit diagram of a push-pull linear amplifier of another embodiment of this invention.

FIG. 3 shows a full push-pull audio amplifier according to another embodiment, but in which elements similar to those in FIG. 1 are identified with similar reference numbers. For the elements of the upper portion of the push-pull circuit, the associated reference numbers have a suffix -a-, and for the elements in the lower portion the associated reference numbers have a suffix -b-.

The normal, i.e., non-inverted input signal is fed to a first input 11a, and an identical but phase-inverted version is fed to a second input 11b. These input signals are supplied to the grids 14a, 14b of the respective driver triodes 13a, 13b. The cathodes 16a, 16b supply output current to the control grids 23a, 23b of respective first and second pentode amplifier tubes 20a and 20b. Grid resistors 24a, 24b connect these to the source of grid bias $-V_G$.

The driver triode anodes or plates 19a, 19b are respectively connected to first and second screen taps 30a, 30b of the transformer primary 27, while the plates 22a, 22b of the first and second output tubes 20a, 20b are connected to first and second end taps 29a, 29b of the primary 27.

In this embodiment these are suppressor grids 32a, 32b disposed between the associated screen grid and plate, and tied to the associated cathode 21a, 21b.

Screen resistors 33a and 33b are also employed, interposed in series between the screen taps 30a, 30b and the respective screen grids 25a, 25b. These resistors 33a, 33b limit plate feedback from the driver stage to the screen grids.

It is also possible to employ triodes as the power or output amplifier tubes, in which case the screen taps 30a, 30b would be tied to the driver stage plates 19a, 19b, but not to the output tube 20a, 20b.

Moreover, the screen grids 25a, 25b can be coupled to a fixed screen voltage source instead of the screen taps 30a, 30b.

While the invention has been described in detail with reference to a few preferred embodiments, it should be understood that the invention is not limited to those embodiments. Rather many modifications and variations would become apparent to those skilled in the art without departing from the scope and spirit of this invention, as defined in the appended claims.

What is claimed is:

1. A linear amplifier comprising a driver stage, a power stage, and an output transformer, wherein said driver stage includes a control electrode coupled to a signal input, a current input electrode, and a current output electrode coupled to an output resistor and to an input of said power stage; said power stage including a power amplifier tube having a cathode, a control grid coupled to said power stage input, and an anode; and said output transformer including a multitap primary having a first tap coupled to a source of dc plate voltage; an end tap connected to the electrode of said power amplifier tube, and an intermediate tap coupled to the current input electrode of said driver stage, such that at low signal levels the driver stage powers the output transformer primary directly while at higher signal levels the power amplifier stage provides an output signal to the output transformer primary.

2. The linear amplifier of claim 1 wherein said driver stage is biased to operate in class A and said power stage is biased to operate in class B.

3. A push-pull linear amplifier comprising a driver stage, a power stage, and an output transformer, wherein said driver stage includes first and second class A amplifier devices each having a control electrode coupled to a signal input, a current input electrode, and a current output electrode coupled to an output resistor and also coupled to a respective input of said power stage; said power stage including first and second power amplifier tubes operated in class B and configured in push-pull, each having a cathode, a control grid coupled to the respective power stage input, and an anode; and wherein said output transformer includes a multitap primary having a center tap coupled to a source of dc plate voltage, first and second end taps connected to the anodes of the respective first and second power amplifier tubes to supply plate voltage thereto, and first and second intermediate taps connected to the current input electrodes of the respective first and second class A amplifier devices; such that at low signal levels the driver stage supplies an output signal directly to said transformer primary and at higher signal levels the power amplifier stage provides an output signal to the output transformer primary.

4. The push-pull linear amplifier of claim 3 wherein said signal input provides a non-inverted input signal to the control electrode of one of said class A amplifier devices and a phase-inverted input signal to the control electrode of the other of said class A amplifier devices.

5. The push-pull linear amplifier of claim 3 wherein said first and second power tubes each have a screen grid that is connected to a respective intermediate tap of said output transformer primary.

6. The push-pull linear amplifier of claim 5 wherein said first and second power tubes are pentodes each having a respective suppressor grid coupled to the cathode thereof.

7. The push-pull linear amplifier of claim 5 wherein said power stage includes first and second screen resistors coupled between the respective screen grids and intermediate taps to reduce driver plate signal feedback to the screen electrodes.

8. The push-pull linear amplifier of claim 3 wherein said class A amplifier devices include triodes configured as cathode followers, with anodes thereof serving as said current input electrodes and cathodes thereof serving as said current output electrodes.

9. A push-pull linear amplifier comprising a driver stage, a power stage, and an output transformer; wherein said driver stage includes first and second class A amplifier devices each having a control electrode coupled to a signal input, a current input electrode, and a current output electrode coupled to an output resistor and ac coupled to a respective input of the power stage; wherein the power stage includes first and second power amplifying tubes operated in class B and configured in push-pull each having a cathode, a control grid coupled to the respective power stage input, an anode, and a screen grid coupled to a dc voltage source; and wherein said output transformer includes a multitap primary having a center tap coupled to a source of dc plate voltage, first and second end taps connected to the nodes of the respective first and second amplifier tubes, and first and second intermediate taps connected to the current input electrodes of the respective first and second class A amplifying devices; such that at low signal levels the driver stage supplies an output signal directly to said output transformer primary and at higher signal levels the power amplifier stage provides an output signal to the output transformer primary.

10. The push-pull linear amplifier of claim 9 wherein said class A amplifier devices include triodes configured as cathode followers, with anodes thereof serving as said current input electrodes and cathodes thereof serving as said current output electrodes.

* * * * *